United States Patent
Sakai

(10) Patent No.: US 11,271,182 B2
(45) Date of Patent: Mar. 8, 2022

(54) DISPLAY DEVICE

(71) Applicant: SHARP KABUSHIKI KAISHA, Sakai (JP)

(72) Inventor: Tamotsu Sakai, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days.

(21) Appl. No.: 17/059,165

(22) PCT Filed: May 29, 2018

(86) PCT No.: PCT/JP2018/020571
§ 371 (c)(1),
(2) Date: Nov. 25, 2020

(87) PCT Pub. No.: WO2019/229854
PCT Pub. Date: Dec. 5, 2019

(65) Prior Publication Data
US 2021/0217985 A1    Jul. 15, 2021

(51) Int. Cl.
*G09G 3/30* (2006.01)
*H01L 51/52* (2006.01)
(Continued)

(52) U.S. Cl.
CPC ....... *H01L 51/5209* (2013.01); *G09G 3/3233* (2013.01); *H01L 27/3216* (2013.01);
(Continued)

(58) Field of Classification Search
CPC ......... G09G 3/3241; G09G 2320/0626; G09G 2320/0247; G09G 2320/043;
(Continued)

(56) References Cited

U.S. PATENT DOCUMENTS 10,381,415 B2 * 8/2019 Sagawa ................... H01L 51/52
2003/0222861 A1    12/2003 Nishikawa et al.
(Continued)

FOREIGN PATENT DOCUMENTS

| JP | 2003-272845 A | 9/2003 |
|---|---|---|
| JP | 2010-026488 A | 2/2010 |

(Continued)

*Primary Examiner* — Duc Q Dinh
(74) *Attorney, Agent, or Firm* — ScienBiziP, P.C.

(57) ABSTRACT

A display device includes: a display portion including a plurality of scanning lines, a plurality of data lines, and a plurality of pixel circuits, wherein each of the plurality of pixel circuits includes an electro-optical element including a first electrode, a second electrode, and a light-emitting element layer disposed between the first electrode and the second electrode, and a drive transistor, and the first electrode is provided with a concave-convex portion on a surface in contact with the light-emitting element layer, a control electrode of the drive transistor is connected to a connection wiring line formed in a wiring line layer closer to a wiring line layer in which the first electrode is formed than a wiring line layer in which the control electrode is formed, and the first electrode is disposed without overlapping the connection wiring line in a plan view.

17 Claims, 14 Drawing Sheets

(51) Int. Cl.
*H05B 45/60* (2022.01)
*G09G 3/3233* (2016.01)
*H01L 27/32* (2006.01)

(52) U.S. Cl.
CPC ......... *H01L 27/3258* (2013.01); *H05B 45/60* (2020.01); *G09G 2310/066* (2013.01); *G09G 2320/045* (2013.01); *G09G 2320/0686* (2013.01); *H01L 27/3276* (2013.01); *H01L 51/5218* (2013.01); *H01L 2251/5315* (2013.01)

(58) Field of Classification Search
CPC ....... G09G 2310/06; G09G 2320/0233; G09G 2300/0426; G09G 3/3291; G09G 2310/066; G09G 2320/045; G09G 3/3233; G09G 2300/0819; G09G 2300/0842; G09G 2300/0861; G09G 2310/0251; G09G 2310/0262; G09G 2320/0686; G09G 3/3225; H01L 2251/5315; H01L 27/32; H01L 27/3258; H01L 27/3276; H01L 51/5209; H01L 51/5218; H01L 29/786; H01L 29/78645; H05B 33/02; H05B 33/12; H05B 33/26; H05B 45/60; G02F 1/136227; G02F 1/136286

See application file for complete search history.

(56) References Cited

U.S. PATENT DOCUMENTS

| | | |
|---|---|---|
| 2005/0082540 A1 | 4/2005 | Nishikawa |
| 2008/0024402 A1 | 1/2008 | Nishikawa et al. |
| 2010/0013816 A1 | 1/2010 | Kwak |
| 2017/0287396 A1 | 10/2017 | Akimoto |
| 2018/0053917 A1* | 2/2018 | Isaka .................. G09G 3/3225 |
| 2018/0374415 A1 | 12/2018 | Morita et al. |

FOREIGN PATENT DOCUMENTS

| | | |
|---|---|---|
| JP | 2017-187608 A | 10/2017 |
| JP | 2018-013567 A | 1/2018 |
| WO | 2005/107327 A1 | 11/2005 |

\* cited by examiner (a)

(b)

(c)

(d)

PRIOR ART

PRIOR ART

DISPLAY DEVICE

TECHNICAL FIELD

The disclosure relates to a display device, and more particularly, to a display device including a pixel circuit including an electro-optical element.

BACKGROUND ART

Organic electroluminescence (EL) display devices including pixel circuits including organic EL elements have recently been coming into practical use. The pixel circuit of the organic EL display device includes a drive transistor, a writing control transistor, and the like in addition to the organic EL element. Thin Film Transistors (TFTs) are used for these transistors. The organic EL element is a kind of an electro-optical element and emits light at brightness according to the amount of flowing current. The drive transistor is provided in series with the organic EL element, and controls the amount of current flowing through the organic EL element.

Variation and fluctuation occur in characteristics of each of the organic EL element and the drive transistor. Thus, the variation and fluctuation in characteristics of each of these organic EL element and drive transistor need to be compensated in order to perform high picture quality display in the organic EL display device. For the organic EL display device, a method for compensating these characteristics inside the pixel circuit and a method for compensating these characteristics outside the pixel circuit are known. In the former method, a process of initializing a voltage of a control electrode of the drive transistor to a predetermined level may be performed before a voltage (data voltage) according to an image signal is written to the pixel circuit. In this case, an initialization transistor is provided in the pixel circuit.

Many circuits have been proposed as pixel circuits including organic EL elements. FIG. 14 and FIG. 15 are circuit diagrams of pixel circuits of known organic EL display devices. A pixel circuit 91 illustrated in FIG. 14 includes an organic EL element L1, six thin film transistors M1 to M6, and a capacitor C1. In FIG. 14, the thin film transistor M1 functions as a drive transistor, the thin film transistor M5 functions as a writing control transistor, and the thin film transistor M3 functions as an initialization transistor.

A pixel circuit 92 illustrated in FIG. 15 includes the organic EL element L1, seven thin film transistors M1 to M7, and the capacitor C1. The pixel circuit 92 is obtained by adding the thin film transistor M7 to the pixel circuit 91. In FIG. 15, the thin film transistor M7 functions as a second initialization transistor that initializes a voltage of an anode electrode of the organic EL element L1. A pixel circuit including a second initialization transistor is described in PTL 1, for example.

CITATION LIST

Patent Literature

PTL 1: JP 2010-26488 A

Incidentally, in the known organic EL display devices as described above, it is desired to extend a lifespan of the organic EL element.

However, in the known organic EL display devices as described above, there is a problem in that it is difficult to extend the lifespan of the organic EL element.

SUMMARY

Technical Problem

Specifically, as described above, the organic EL element emits light at brightness according to the amount of flowing current, but a function layer made of an organic material contained in the organic EL element (light-emitting element layer) may deteriorate according to the amount per unit area of the flowing current (that is, current density) and the lifespan of the organic EL element may be shortened. To suppress such a decrease in the lifespan of the organic EL element due to aging, for example, it is conceivable to enlarge an anode electrode (first electrode) of the organic EL element and reduce the current density flowing from the anode electrode to the light-emitting element layer. However, when the anode electrode is enlarged as described above, for example, coupling capacitance may be generated in the pixel circuit so as to cause another problem in that a step response occurs, which makes it difficult to extend the lifespan of the organic EL element.

In particular, for example, in the pixel circuit 91 or 92, when the anode electrode of the organic EL element L1 is enlarged, coupling capacitance Cx is generated between the anode electrode and a node N1 to which a gate electrode of the thin film transistor M1 is connected.

When the coupling capacitance Cx is generated in the pixel circuit 91, a phenomenon where white display cannot be properly performed in a first few frame periods in which white display needs to be performed may occur in a case where white display is performed after black display. This phenomenon is called a step response. In the pixel circuit 92, an influence of a previous frame can be eliminated, and a step response can be prevented by initializing a voltage of the anode electrode of the organic EL element L1 by using the thin film transistor M7. However, a data voltage needs to be increased by the coupling capacitance Cx in the pixel circuit 92. Thus, when the coupling capacitance Cx is generated in the pixel circuit 92, power consumption of the organic EL display device increases. Further, a gate electrode of the thin film transistor M7 is connected to a scanning line Gi, and thus a problem also arises that a step response occurs at the time of resetting.

In light of the above problems, an object of the disclosure is to provide a display device in which a step response can be prevented from occurring even when the lifespan is extended.

Solution to Problem

To achieve the above object, a display device according to the disclosure includes a display portion including a plurality of scanning lines, a plurality of data lines, and a plurality of pixel circuits, a scanning line drive circuit configured to drive the plurality of scanning lines, and a data line drive circuit configured to drive the plurality of data lines, in which each of the plurality of pixel circuits includes an electro-optical element including a first electrode, a second electrode, and a light-emitting element layer disposed between the first electrode and the second electrode, provided on a path connecting a first conductive member and a second conductive member for supplying a power supply voltage, and configured to emit light at brightness according to a current flowing through the path, and a drive transistor provided in series with the electro-optical element on the path and configured to control an amount of current flowing through the path, and the first electrode of the electro-optical element is provided with a concave-convex portion on a surface in contact with the light-emitting element layer, a control electrode of the drive transistor is connected to a connection wiring line formed in a wiring line layer closer to a wiring line layer in which the first electrode of the electro-optical element is formed than a wiring line layer in which the control electrode of the drive transistor is formed, and the first electrode of the electro-optical element is disposed without overlapping the connection wiring line in a plan view.

Advantageous Effects of Disclosure

In the first electrode of the electro-optical element, the concave-convex portion is formed on the surface in contact with the light-emitting element layer. Therefore, the current density of the current flowing from the first electrode to the light-emitting element layer can be reduced, and the lifespan of the electro-optical element and thus the lifespan of the display device can be extended. Further, the first electrode of the electro-optical element is disposed without overlapping the connection wiring line in a plan view, and thus the step response can be prevented from occurring.

BRIEF DESCRIPTION OF DRAWINGS

FIG. 8(a) is a plan view illustrating a mask used to form a flattening film which is a lower layer of the anode electrode described in the above, and FIGS. 8(b) to 8(d) are diagrams for describing specific steps of forming the flattening film.

DESCRIPTION OF EMBODIMENTS

Embodiments of the disclosure will be described below in detail with reference to the drawings. The disclosure is not limited to the embodiments described below. Note that the following description will be made by giving an example in which the disclosure is applied to an organic EL display device including a pixel circuit including an organic EL element. The organic EL element is a kind of electro-optical element, and is also called an organic light emitting diode or an OLED. In the following description, m and n represent integers greater than or equal to 2, i represents an integer greater than or equal to 1 and less than or equal to m, and j represents an integer greater than or equal to 1 and less than or equal to n. In addition, in each of the drawings, the dimensions of constituent elements are not precisely illustrated as the actual dimensions of the constituent elements and the dimensional proportions of each of the constituent elements.

First Embodiment

Figure 1:
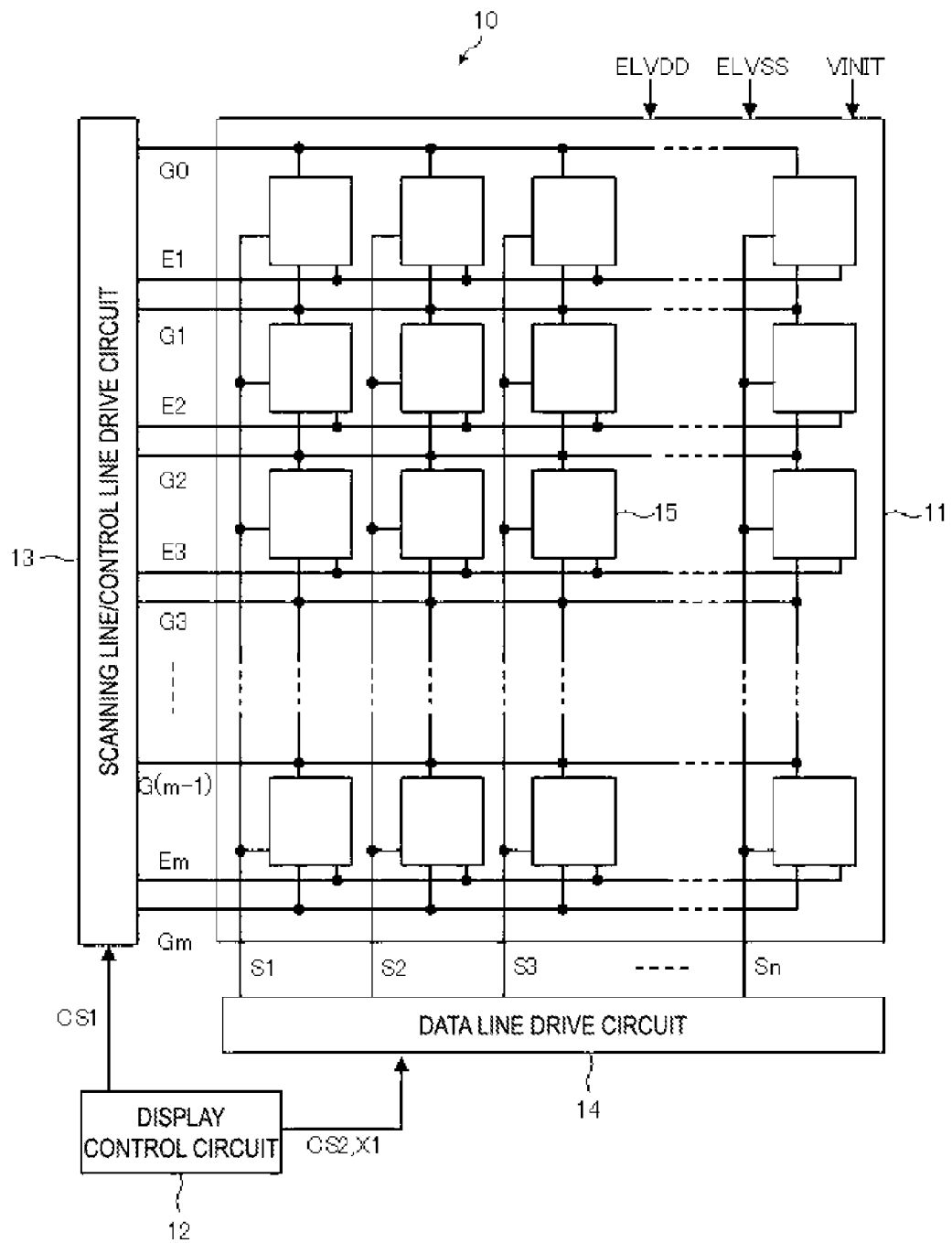
FIG. 1 is a block diagram illustrating a configuration of an organic EL display device according to a first embodiment.

FIG. 1 is a block diagram illustrating a configuration of an organic EL display device according to a first embodiment. In FIG. 1, an organic EL display device 10 includes a display portion 11, a display control circuit 12, a scanning line/control line drive circuit 13, and a data line drive circuit 14. The scanning line/control line drive circuit 13 is a circuit in which a scanning line drive circuit that drives a scanning line and a control line drive circuit that drives a control line are combined. The term "scanning line/control line drive circuit" means a scanning line drive circuit and a control line drive circuit.

The display portion 11 includes (m+1) scanning lines G0 to Gm, n data lines S1 to Sn, n control lines E1 to Em, and (m×n) pixel circuits 15. The scanning lines G0 to Gm are arranged parallel to each other. The data lines S1 to Sn are arranged orthogonal to the m scanning lines G1 to Gm and parallel to each other. The scanning lines G1 to Gm and the data lines S1 to Sn intersect at (m×n) locations. The (m×n) pixel circuits 15 are two-dimensionally arranged corresponding to the intersections of the scanning lines G1 to Gm and the data lines S1 to Sn. The control lines E1 to Em are arranged parallel to the scanning lines G0 to Gm. Each of the pixel circuits 15 is constantly supplied with voltages of three kinds (a high-level power supply voltage ELVDD, a low-level power supply voltage ELVSS, and an initialization voltage VINIT) by using a wiring line or an electrode (not illustrated). Hereinafter, it is assumed that the high-level power supply voltage ELVDD is supplied from a high-level power supply wiring line, and the low-level power supply voltage ELVSS is supplied from a common electrode.

In the organic EL display device 10, a first pixel circuit for red, a second pixel circuit for green, and a third pixel circuit for blue are included in each of the (m×n) pixel circuits 15. The first, second, and third pixel circuits include first, second, and third electro-optical elements (organic EL elements described later) that emit red light, green light, and blue light, respectively. Further, in the organic EL display device 10, an arrangement pattern of the first to third pixel circuits is, for example, a PenTile arrangement pattern (described in detail later), and the high-resolution display portion 11 is configured with a small number of pixels (number of subpixels).

The display control circuit 12 outputs a control signal CS1 to the scanning line/control line drive circuit 13, and outputs a control signal CS2 and an image signal X1 to the data line drive circuit 14. The scanning line/control line drive circuit 13 drives the scanning lines G0 to Gm and the control lines E1 to Em on the basis of the control signal CS. The data line drive circuit 14 drives the data lines S1 to Sn on the basis of the control signal CS2 and the image signal X1.

More specifically, (m+1) line periods from 0-th to m-th line periods are set in one frame period. In the 0-th line period, the scanning line/control line drive circuit 13 applies an on voltage (a voltage at which a thin film transistor is turned on, here, a low-level voltage) to the scanning line G0, and applies an off voltage (a voltage at which the thin film transistor is turned off, here, a high-level voltage) to the scanning lines G1 to Gm. In an i-th line period, the scanning line/control line drive circuit 13 applies an on voltage to an i-th scanning line Gi, and applies an off voltage to remaining in scanning lines. In this way, the pixel circuits 15 in an i-th row are collectively selected in the i-th line period. The data line drive circuit 14 applies n data voltages according to the image signal X1 to the data lines S1 to Sn on the basis of the control signal CS2. In this way, the n data voltages are written to the respective pixel circuits 15 in the i-th row in the i-th line period.

Figure 2:
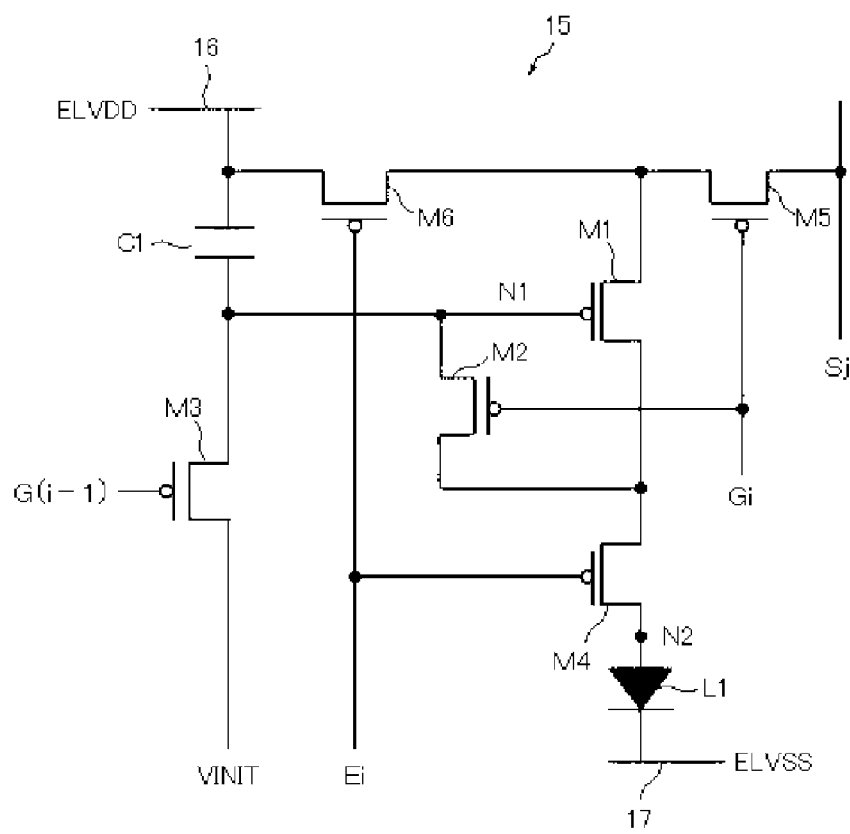
FIG. 2 is a circuit diagram illustrating a pixel circuit of the organic EL display device illustrated in FIG. 1.

FIG. 2 is a circuit diagram illustrating a pixel circuit of the organic EL display device illustrated in FIG. 1. As exemplified in FIG. 2, the pixel circuit 15 in the i-th row and a j-th column is illustrated. In FIG. 2, the pixel circuit 15 includes an organic EL element L1, six thin film transistors M1 to M6, and a capacitor C1, and is connected to scanning lines Gi and G(i−1), a control line Ei, and a data line Sj. Such a configuration of the pixel circuit 15 is called a 6T1C configuration. The thin film transistors M1 to M6 are p-channel transistors.

Note that the thin film transistors M1 to M6 included in the pixel circuit 15 may be amorphous silicon transistors including a channel layer made of an amorphous silicon, low-temperature polysilicon transistors including a channel layer made of a low-temperature polysilicon, or oxide semiconductor transistors including a channel layer made of an oxide semiconductor. For example, Indium Gallium Zinc Oxide (IGZO) may be used as the oxide semiconductor.

A source electrode of the thin film transistor M6 and one electrode of the capacitor C1 (an upper electrode in FIG. 2) are connected to a high-level power supply wiring line 16 for supplying the high-level power supply voltage ELVDD. A first conduction electrode of the thin film transistor M5 (a right electrode in FIG. 2) is connected to the data line Sj. A drain electrode of the thin film transistor M6 and a second conduction electrode of the thin film transistor M5 are connected to a source electrode of the thin film transistor M1. A drain electrode of the thin film transistor M1 is connected to a first conduction electrode of the thin film transistor M2 (a lower electrode in FIG. 2) and a source electrode of the thin film transistor M4. A drain electrode of the thin film transistor M4 is connected to an anode electrode of the organic EL element L1 (first electrode). A cathode electrode of the organic EL element L1 (second electrode) is connected to a common electrode 17 for supplying the low-level power supply voltage ELVSS. A gate electrode of the thin film transistor M1 is connected to a second conduction electrode of the thin film transistor M2, the other electrode of the capacitor C1, and a first conduction electrode of the thin film transistor M3 (an upper electrode in FIG. 2). The initialization voltage VINIT is applied to a second conduction electrode of the thin film transistor M3. A gate electrode of the thin film transistor M2 and a gate electrode of the thin film transistor M5 are connected to the scanning line Gi, and a gate electrode of the thin film transistor M4 and a gate electrode of the thin film transistor M6 are connected to the control line Ei. A gate electrode of the thin film transistor M3 is connected to the scanning line G(i−1) together with gate electrodes of thin film transistors M2 and M5 included in a pixel circuit 15 in an adjacent row. Hereinafter, a node to which the gate electrode of the thin film transistor M1 is connected is referred to as N1, and a node to which the anode electrode of the organic EL element L1 is connected is referred to as N2.

The organic EL element L1 is provided on a path connecting a first conductive member (the high-level power supply wiring line 16) and a second conductive member (the common electrode 17) for supplying a power supply voltage, and functions as an electro-optical element that emits light at brightness according to a current flowing through the path. The thin film transistor M1 is provided in series with the electro-optical element on the path and functions as a drive transistor that controls the amount of current flowing through the path. The thin film transistor M5 functions as a writing control transistor including the first conduction electrode connected to the data line Sj, the second conduction electrode connected to a first conduction electrode of the drive transistor (the source electrode of the thin film transistor M1), and a control electrode connected to the scanning line Gi. The thin film transistor M2 functions as a threshold value compensation transistor including the first conduction electrode connected to a second conduction electrode of the drive transistor (the drain electrode of the thin film transistor M1), the second conduction electrode connected to a control electrode of the drive transistor (the gate electrode of the thin film transistor M1), and a control electrode connected to the scanning line Gi. The thin film transistor M6 functions as a first light emission control transistor including a first conduction electrode connected to the first conductive member (the high-level power supply wiring line 16), a second conduction electrode connected to the first conduction electrode of the drive transistor, and a control electrode connected to the control line Ei. The thin film transistor M4 functions as a second light emission control transistor including a first conduction electrode connected to the second conduction electrode of the drive transistor, a second conduction electrode connected to a first electrode of the electro-optical element (the anode electrode of the organic EL element L1), and a control electrode connected to the control line Ei. The capacitor C1 is provided between the first conductive member and the control electrode of the drive transistor. A second electrode of the electro-optical element (the cathode electrode of the organic EL element L1) is connected to the second conductive member (the common electrode 17). The thin film transistor M3 functions as an initialization transistor including the first conduction electrode connected to the control electrode of the drive transistor, and the second conduction electrode to which the initialization voltage VINIT is applied. A control electrode of the initialization transistor is connected to the scanning line G(i−1) of the pixel circuit in an adjacent row.

Figure 3:
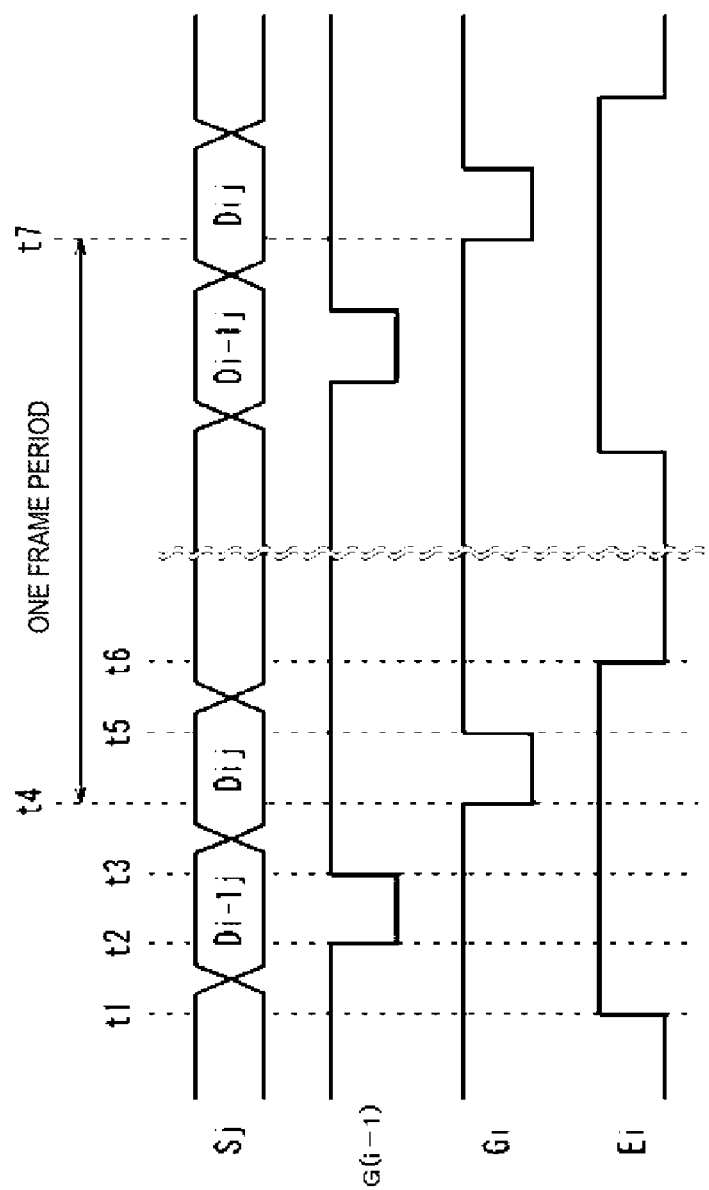
FIG. 3 is a timing chart of the organic EL display device illustrated in FIG. 1.

FIG. 3 is a timing chart of the organic EL display device illustrated in FIG. 1. FIG. 3 illustrates changes in input signals when writing a data voltage to the pixel circuit 15 in the i-th row and the j-th column. In FIG. 3, a period from a time t4 to a time t7 corresponds to one frame period. Hereinafter, signals on the scanning lines Gi and G(i−1) are referred to as scanning signals Gi and G(i−1), respectively, and a signal on the control line Ei is referred to as a control signal Ei.

The scanning signals Gi and G(i−1) are at a high level and the control signal Ei is at a low level before a time t1. Thus, the thin film transistors M4 and M6 are in an on state, and the thin film transistors M2, M3, and M5 are in an off state. At this time, when a gate-source voltage of the thin film transistor M1 is less than or equal to a threshold voltage, a current flows from the high-level power supply wiring line 16 toward the common electrode 17 via the thin film transistors M6, M1, and M4 and the organic EL element L1, and the organic EL element L1 emits light at brightness according to the amount of the flowing current.

The control signal Ei is changed to the high level at the time t1. Accordingly, the thin film transistors M4 and M6 are in the off state. Thus, no current flows via the organic EL element L1 at and after the time t1, and the organic EL element L1 is brought into a non-emitting state.

Next, the scanning signal G(i−1) is changed to the low level at a time t2. Accordingly, the thin film transistor M3 turns to the on state. Thus, a gate voltage of the thin film transistor M1 is initialized to the initialization voltage VINIT. The level of the initialization voltage VINIT is set low such that the thin film transistor M1 turns to the on state immediately after the scanning signal Gi is changed to the low level.

Next, the scanning signal G(i−1) is changed to the high level at a time t3. Accordingly, the thin film transistor M3 turns to the off state. Thus, the initialization voltage VINIT is not applied to the gate electrode of the thin film transistor M1 at and after the time t3.

Next, the scanning signal Gi is changed to the low level at the time t4. Accordingly, the thin film transistors M2 and M5 turn to the on state. The gate electrode and the drain electrode of the thin film transistor M1 are electrically connected to each other via the thin film transistor M2 in the on state at and after the time 4, and thus the thin film transistor M1 is in a diode-connected state. Thus, a current flows from the data line Sj toward the gate electrode of the thin film transistor M1 via the thin film transistors M5, M1, and M2. The gate voltage of the thin film transistor M1 rises due to this current. When the gate-source voltage of the thin film transistor M1 is equal to the threshold voltage of the thin film transistor M1, no current flows. Given that the threshold voltage of the thin film transistor M1 is Vth and a voltage of the data line Sj in a period from the time t4 to a time t5 is Vd, the gate voltage of the thin film transistor M1 after a lapse of sufficient time from the time t4 is (Vd−|Vth|).

Next, the scanning signal Gi is changed to the high level at the time t5. Accordingly, the thin film transistors M2 and M5 turn to the off state. At and after the time t5, the capacitor C1 holds an inter-electrode voltage (ELVDD−Vd+|Vth|).

Next, the control signal Ei is changed to the low level at a time t6. Accordingly, the thin film transistors M4 and M6 turn to the on state. At and after the time t6, a current flows from the high-level power supply wiring line 16 toward the common electrode 17 via the thin film transistors M6, M1, and M4 and the organic EL element L1. A gate-source voltage Vgs of the thin film transistor M1 is held at (ELVDD−Vd+|Vth|) by the action of the capacitor C1. Therefore, a current I1 flowing at and after the time t6 is given by Equation (1) below by using a constant K.

$$I1 = K(Vgs - |Vth|)^2 \quad (1)$$
$$= K(ELVDD - Vd)^2$$

As described above, the organic EL element L1 emits light at brightness according to the data voltage Vd written to the pixel circuit 15 at and after the time t6 regardless of the threshold voltage Vth of the thin film transistor M1.

Figure 4:
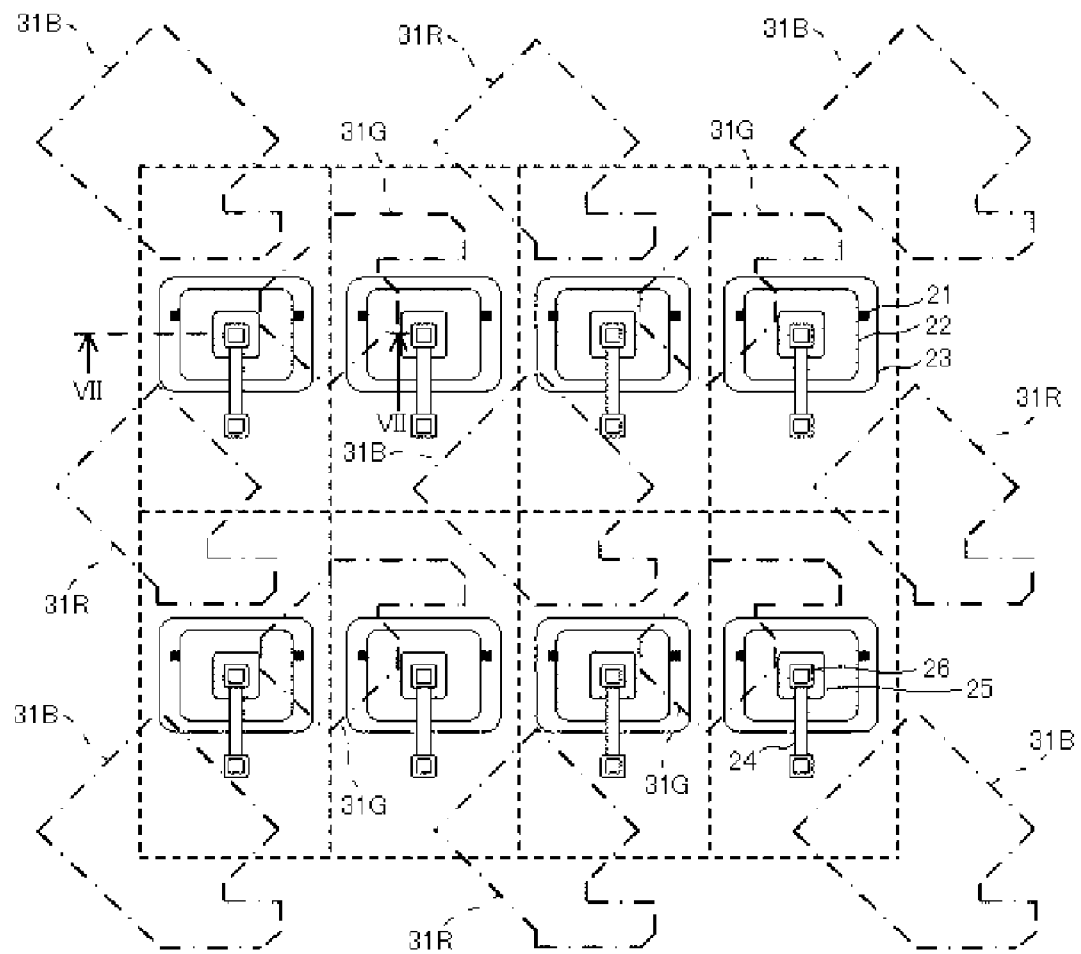
FIG. 4 is a layout diagram of the pixel circuit illustrated in FIG. 2.

FIG. 4 is a layout diagram of the pixel circuit illustrated in FIG. 2. FIG. 4 illustrates a layout near the gate electrode of the thin film transistor M1 and anode electrodes 31R, 31G, and 31B for the red, green, and blue organic EL elements L1 (hereinafter collectively referred as "anode electrode 31"). Note that each layout diagram is not a faithful illustration of the layout, but are abstracted to the extent that the features of the layout are understandable. Further, a region surrounded by a broken line corresponds to one subpixel. Furthermore, as described above, in the organic EL display device 10, the arrangement pattern of the first to third pixel circuits is, for example, the PenTile arrangement pattern. Specifically, in the PenTile arrangement pattern, for example, two subpixels adjacent to each other on an upper right in FIG. 4 are a red subpixel including a first organic EL element L1 that has an anode electrode 31R and emits red light, and a green subpixel including a second organic EL element L1 that has an anode electrode 31G and emits green light, and configure one pixel, and two subpixels adjacent to each other on a lower right in FIG. 4 are a blue subpixel including a third organic EL element L1 that has an anode electrode 31B and emits blue light, and a green subpixel including the second organic EL element L1 that has the anode electrode 31G, and configure one pixel, and these two types of pixels are repeatedly arranged in the vertical direction of FIG. 4.

In the organic EL display device 10, in the first to third organic EL elements L1, the sizes of the respective anode electrodes 31 are different from each other. Specifically, as illustrated by the alternate long and short dash lines in FIG. 4, the anode electrode 31B of the third organic EL element L1 is configured to be larger than the anode electrode 31R of the first organic EL element L1, and the anode electrode 31R of the first organic EL element L1 is configured to be larger than the anode electrode 31G of the second organic EL element L1. By changing the sizes of the anode electrodes 31R, 31G, and 31B in this manner, the lifespans of the first to third organic EL elements L1 can be easily equalized, and thus the reliability of the organic EL display device 10 can be easily improved.

Figure 5:
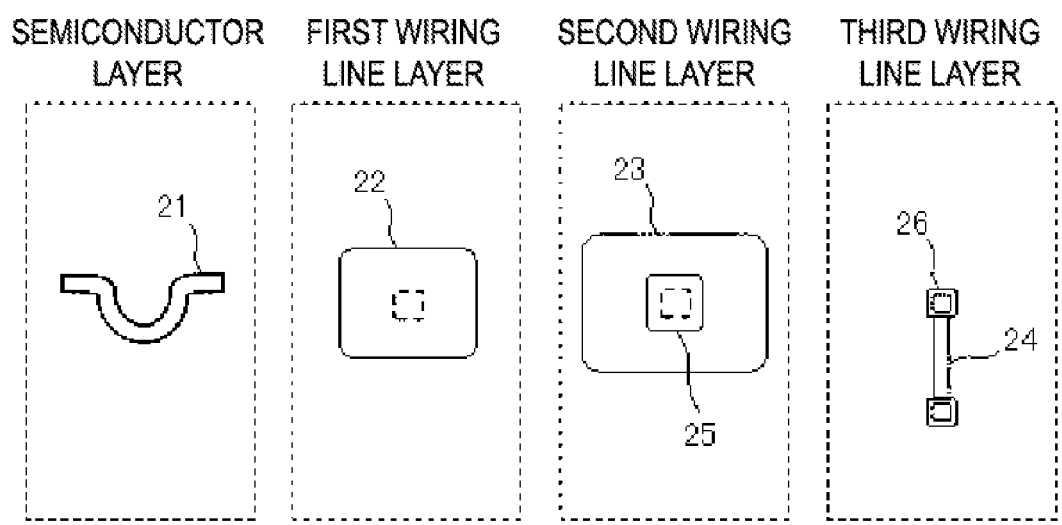
FIG. 5 is a diagram illustrating the configuration of FIG. 4 being divided into a plurality of layers.

FIG. 5 is a diagram illustrating the configuration illustrated in FIG. 4 being divided into a plurality of layers. The pixel circuit 15 is formed by forming a semiconductor layer, first to third wiring line layers, an anode electrode layer, and the like on a substrate in order. The first to third wiring line layers are metal wiring line layers. As illustrated in FIG. 5, a semiconductor portion 21, a gate electrode 22, a capacitance wiring line 23, and a connection wiring line 24 are formed in the semiconductor layer and the first to third wiring line layers, respectively. The semiconductor portion 21 functions as a channel region of the thin film transistor M. The gate electrode 22 is the gate electrode of the thin film transistor M1, and is formed to cover the semiconductor portion 21. The capacitance wiring line 23 is a wiring line for forming a capacitance in a pixel circuit, and is disposed overlapping the gate electrode 22 in a plan view. The high-level power supply voltage VDD is applied to the capacitance wiring line 23, and the capacitance wiring line 23 also functions as the high-level power supply wiring line 16. The gate electrode 22 and the capacitance wiring line 23 are disposed to face each other, and thus the capacitor C1 illustrated in FIG. 2 is formed. The gate electrode 22 also functions as the other electrode (the lower electrode in FIG. 2) of the capacitor C1.

As described above, in the organic EL display device 10, the gate electrode 22 of the thin film transistor M1 is formed in the first wiring line layer, the capacitance wiring line 23 is formed in the second wiring line layer in a layer above the first wiring line layer, the connection wiring line 24 is formed in the third wiring line layer in a layer above the second wiring line layer, and the anode electrode 31 of the organic EL element L1 is formed in a layer above the third wiring line layer.

Another conduction electrode of the thin film transistor M2 and one conduction electrode of the thin film transistor M3 in addition to the gate electrode 22 of the thin film transistor M1 and the other electrode of the capacitor C1 are connected to the node N1 illustrated in FIG. 2. The connection wiring line 24 is formed for electrically connecting the other conduction electrode of the thin film transistor M2 and the one conduction electrode of the thin film transistor M3 to the gate electrode 22. To electrically connect the gate electrode 22 formed in the first wiring line layer to the connection wiring line 24 formed in the third wiring line layer, an opening 25 is formed in a second inorganic insulating film described later, the capacitance wiring line 23 formed in the second wiring line layer, and a third inorganic insulating film described later, and a contact hole 26 connecting the first wiring line layer to the third wiring line layer is formed in the opening 25. The gate electrode 22 and the connection wiring line 24 are electrically connected to each other through the contact hole 26. Further, as illustrated in FIG. 4, the opening 25 overlaps the semiconductor portion 21 (that is, the semiconductor layer). As a result, the pixel circuit 15 can be easily made compact.

Figure 6:
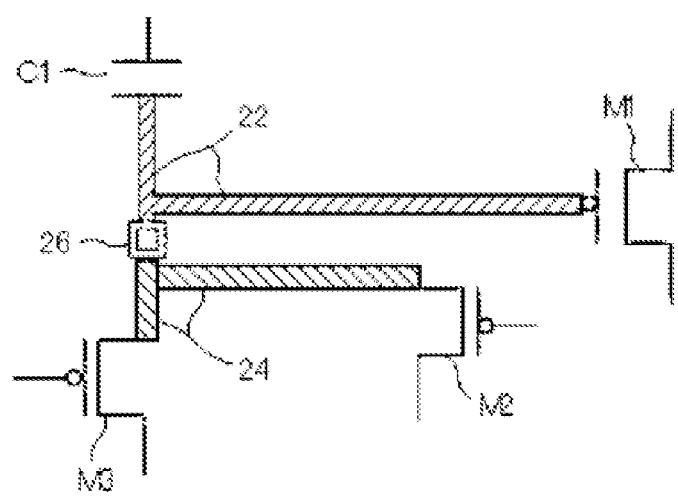
FIG. 6 is a diagram illustrating a wiring line layer of a node N1 of the pixel circuit illustrated in FIG. 2.

FIG. 6 is a diagram illustrating a wiring line layer of the node N1 of the pixel circuit illustrated in FIG. 2. As illustrated in FIG. 6, the gate electrode of the thin film transistor M1 and the other electrode of the capacitor C1 are electrically connected to each other with the gate electrode 22 formed in the first wiring line layer. The other conduction electrode of the thin film transistor M2 and the one conduction electrode of the thin film transistor M3 are electrically connected to the gate electrode 22 through the connection wiring line 24 formed in the third wiring line layer and the contact hole 26 connecting the first wiring line layer to the third wiring line layer.

Figure 7:
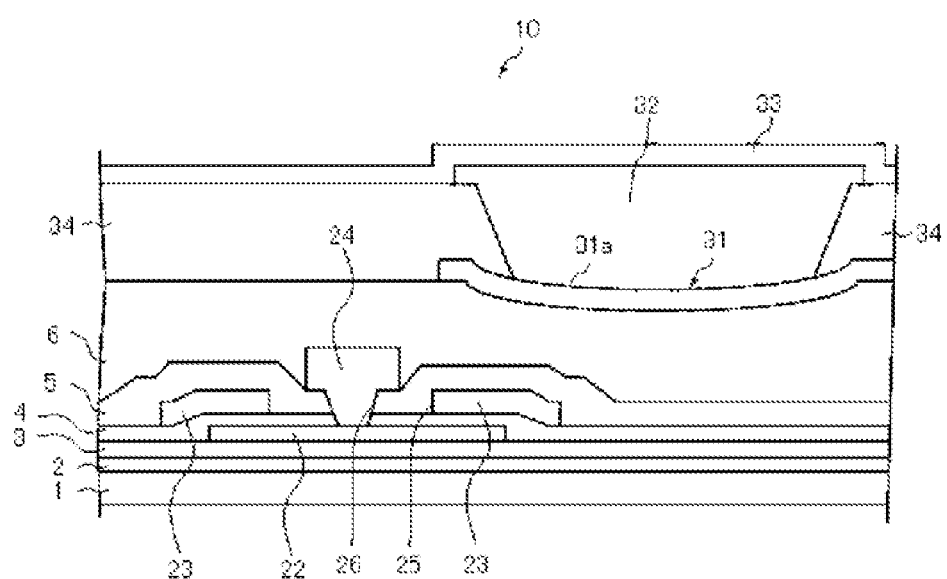
FIG. 7 is a diagram illustrating a configuration of main portions of the organic EL display device illustrated in FIG. 1 and is a cross-sectional view taken along line VII-VII of FIG. 4.

FIG. 7 is a diagram illustrating a configuration of main portions of the organic EL display device illustrated in FIG. 1 and is a cross-sectional view taken along line VII-VII of FIG. 4. In FIG. 7, the organic EL display device 10 is a top-emitting device that emits light toward an upper side. The organic EL display device 10 includes, in order from the bottom, a resin layer 1, a base coat layer 2, a first inorganic insulating film (gate insulating film) 3, the second inorganic insulating film 4, the third inorganic insulating film 5, and a flattening film 6.

For the resin layer 1, for example, a polyimide resin, an epoxy resin, a polyamide resin, or the like is used. The base coat layer 2 is a layer that prevents water, oxygen, and the like from reaching the thin film transistors M1 to M6 and the organic EL element L1, and is formed of, for example, a silicon oxide film, a silicon nitride film, or a silicon oxynitride film, or a layered film thereof formed by CVD.

The first inorganic insulating film 3, the second inorganic insulating film 4, and the third inorganic insulating film 5 are formed of, for example, a silicon oxide (SiOx) film or a silicon nitride (SiNx) film, or a layered film thereof formed by CVD. The first inorganic insulating film 3 is provided between the first wiring line layer and the semiconductor layer 21 provided on the base coat layer 2. The second inorganic insulating film 4 is provided between the first wiring line layer and the second wiring line layer. The third inorganic insulating film 5 is provided between the second wiring line layer and the third wiring line layer.

The flattening film 6 is formed using a resin such as an acrylic resin, a polyimide resin, or an epoxy resin, for example. The flattening film 6 is provided between the third wiring line layer and the anode electrode 31.

In the organic EL display device 10, the organic EL element L1 (FIG. 2) is provided on the flattening film 6. In other words, the organic EL element L1 includes the anode electrode (first electrode) 31 formed on the flattening film 6, a cathode electrode (second electrode) 33 provided above the anode electrode 31, and a light-emitting element layer 32 provided between the anode electrode 31 and the cathode electrode 33. The anode electrode 31 and the light-emitting element layer 32 are provided for each of the subpixels. The cathode electrode 33 is provided in common with all of the subpixels. An edge cover 34 surrounding an edge of the anode electrode 31 is formed on the flattening film 6. For the edge cover 34, for example, an organic film made of a polyimide resin, an acrylic resin, a polysiloxane resin, a novolac resin, or the like is used.

The anode electrode 31 is formed by layering Indium Tin Oxide (ITO) and an alloy containing Ag, and has light reflectivity. In other words, the anode electrode 31 is a reflective electrode that reflects light from the light-emitting element layer 32 toward the display surface side of the display portion 11.

The light-emitting element layer 32 is formed in a region (a light-emitting region) surrounded by the edge cover 34 by vapor deposition or an ink-jet method. In the light-emitting element layer 32, for example, a hole injection layer, a hole transport layer, a light-emitting layer, an electron transport layer, and an electron injection layer are sequentially layered from the anode electrode 31 side (not illustrated).

The cathode electrode 33 is made of a transparent conductive material such as ITO or Indium Zinc Oxide (IZO).

In the organic EL display device 10 of the present embodiment, the anode electrode 31 is configured in a mortar shape, as illustrated in FIG. 7. In other words, in the anode electrode 31, a surface 31a closer to the light-emitting element layer 32 is formed so as to be recessed from a peripheral portion toward a central portion. As a result, in the organic EL display device 10 of the present embodiment, compared with a case where the surface closer the light-emitting element layer 32 is configured to be flat, the current density of the current flowing from the anode electrode 31 to the light-emitting element layer 32 can be reduced.

Further, the surface of the flattening film 6 closer to the anode electrode 31 is formed in a mortar shape, and the anode electrode 31 is configured in a mortar shape.

Figure 8:
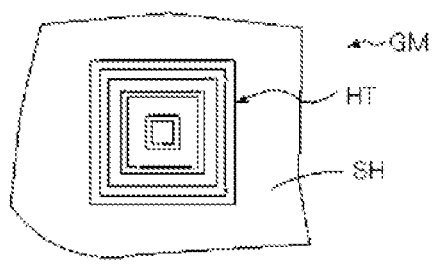
FIG. 8 is a diagram for describing a specific method for forming the anode electrode illustrated in FIG. 7.
Figure 8:
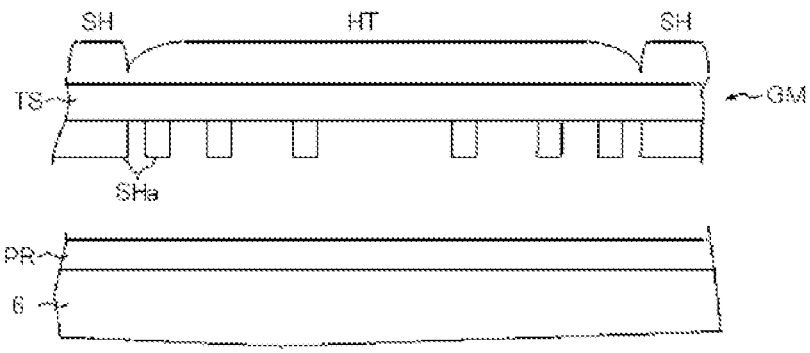
Figure 8:
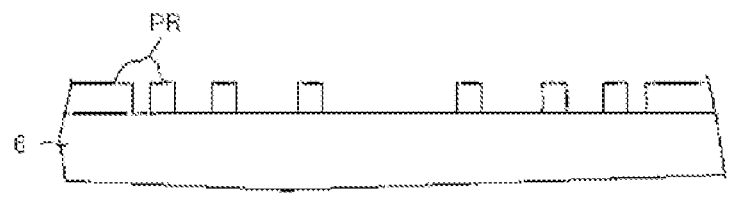
Figure 8:
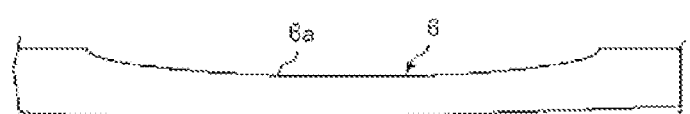

A specific method for forming the anode electrode 31 will be described with reference to FIG. 8. FIG. 8 is a diagram for describing the specific method for forming the anode electrode illustrated in FIG. 7. FIG. 8(a) is a plan view illustrating a mask used to form a flattening film below the anode electrode. FIGS. 8(b) to 8(d) are diagrams for describing specific steps of forming the flattening film.

An exposure mask GM in FIG. 8(a) is a mask used to form the flattening film 6, and is a multi-gray scale mask having a light blocking portion SH and a translucent portion HT. Specifically, as illustrated in FIG. 8(b), the exposure mask GM is a gray tone mask formed with a light blocking film SHa having a light blocking pattern corresponding to the light blocking portion SH and a light blocking pattern having a line width less than the resolution (resolution limit) of the exposure device in the translucent portion HT on a transparent substrate TS such as a glass substrate. In addition, in the exposure mask GM, the translucent portion HT is configured by a gray tone portion in which the light blocking pattern referred to as a line and a slit pattern having a line width less than the resolution (resolution limit) of the exposure device, referred to as a space are repeatedly formed at constant intervals.

Further, as illustrated in FIG. 8(b), for example, the translucent portion HT of the exposure mask GM is disposed so as to face a region where the anode electrode 31 is to be formed on the flattening film 6 with respect to the flattening film 6 of which the positive photoresist PR is formed covering the entire surface. Then, in the step of forming the flattening film 6, the photoresist PR is irradiated with light emitted from above the exposure mask GM and exposed. In the exposure of the photoresist PR, light reaches a portion corresponding to (overlapping) a region where the light blocking film SHa is not formed, and light does not reach a portion corresponding to (overlapping) a region where the light blocking film SHa is formed. Thereafter, as illustrated in FIG. 8(c), the photoresist PR is developed with a developing solution, so that only the unexposed portion of the photoresist PR, which overlaps the light blocking film SHa, remains without being removed.

Subsequently, as illustrated in FIG. 8(d), the flattening film 6 is etched using the developed photoresist PR as a mask to selectively remove the flattening film 6 so that a surface 6a of the flattening film 6 (a surface closer to the anode electrode 31) is formed so as to be recessed from the peripheral portion toward the center portion, and the flattening film 6 is configured in a mortar shape in the region where the anode electrode 31 is formed. Then, the step of forming the flattening film 6 is completed by performing a baking process on the flattening film 6 having a portion configured in a mortar shape.

Next, a step of forming the anode electrode 31 is performed. In other words, the anode electrode material film made of the material of the anode electrode 31 is formed on the surface of the flattening film 6 by, for example, sputtering and is further patterned so that the anode electrode 31 configured in a mortar shape as illustrated in FIG. 7 is formed. As a result, the step of forming the anode electrode 31 is completed.

Figure 9:
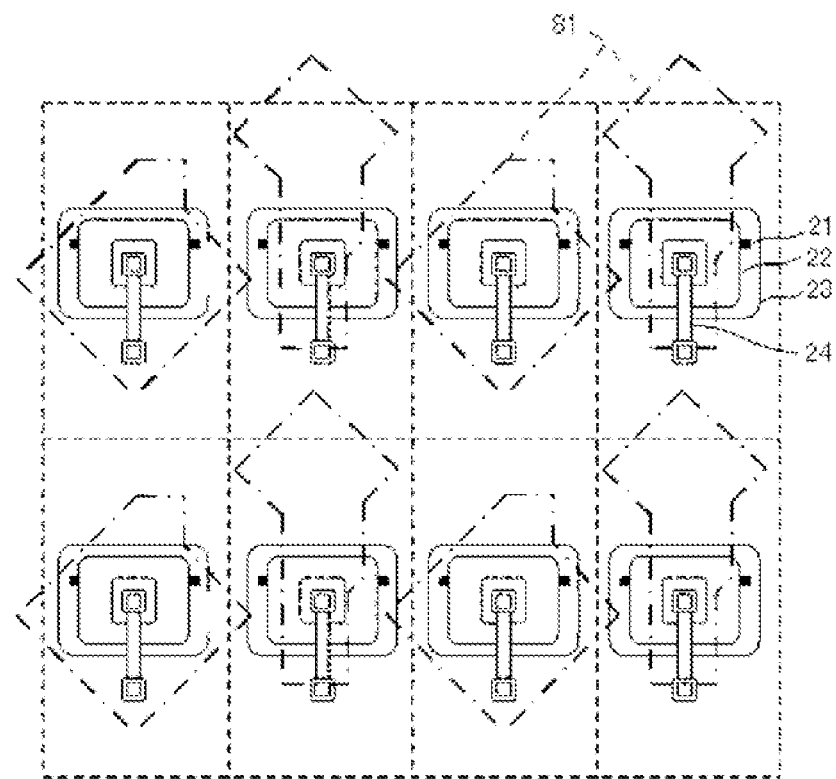
FIG. 9 is a layout diagram of a pixel circuit according to a comparative example.
Figure 14:
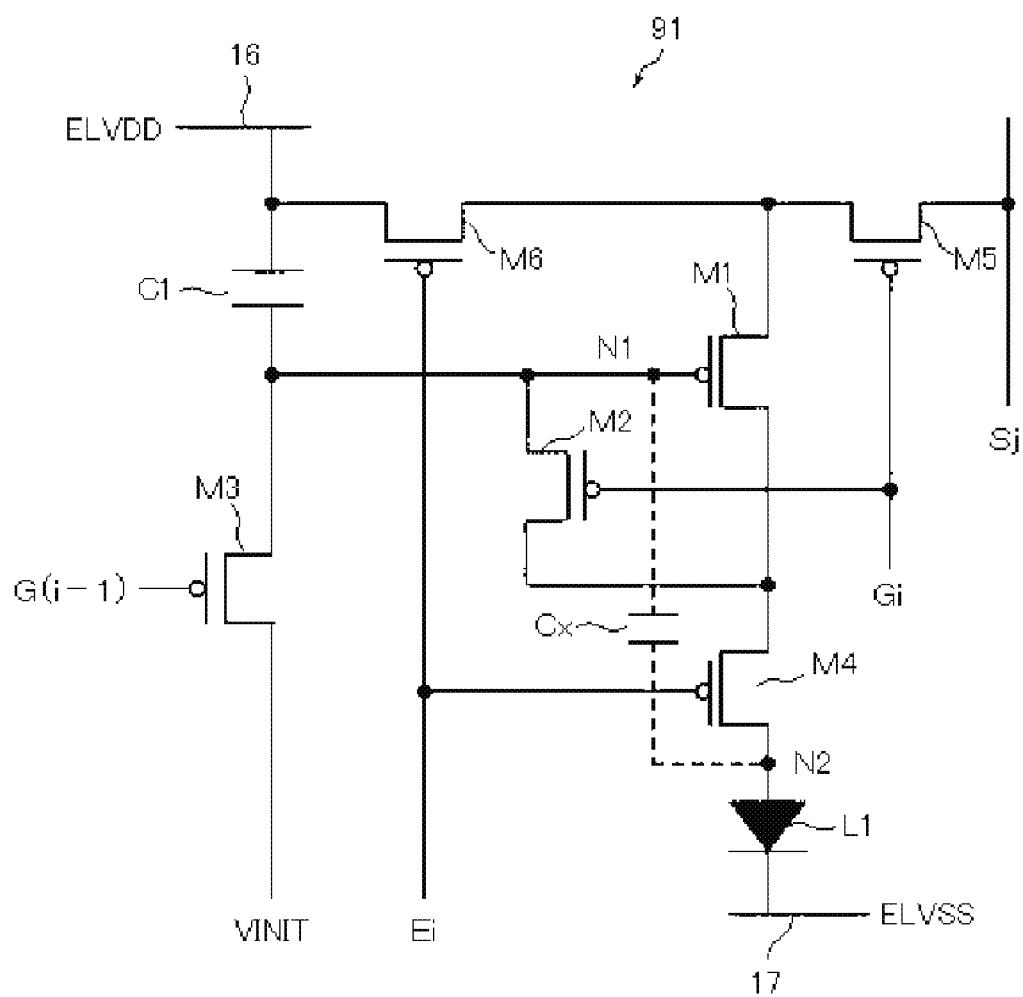
FIG. 14 is a circuit diagram of a pixel circuit of a known organic EL display device.
Figure 15:
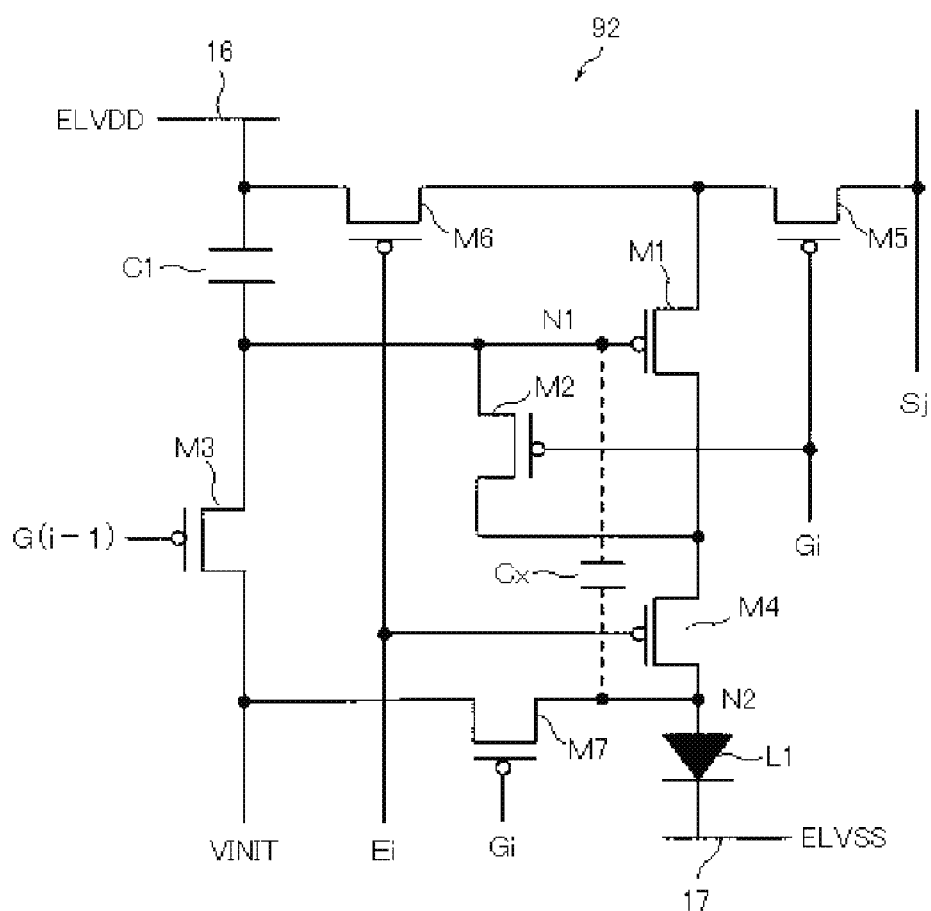
FIG. 15 is a circuit diagram of a pixel circuit of a known organic EL display device.

FIG. 9 is a layout diagram of a pixel circuit according to a comparative example. FIG. 9 illustrates a layout of a known pixel circuit 91 illustrated in FIG. 14. FIG. 9 illustrates a layout near the gate electrode of the thin film transistor M1 and a layout of an anode electrode 81 of the organic EL element L1, similarly to FIG. 4.

As illustrated in FIGS. 4 and 9, the pixel circuit 15 according to the present embodiment is different from the known pixel circuit 91 in the layout of the anode electrode of the organic EL element L1. As illustrated in FIG. 9, in the known pixel circuit 91, the anode electrode 81 of the organic EL element L1 is laid out such that the gate electrode 22 and the connection wiring line 24 are allowed to overlap the anode electrode 81 in a plan view. As a result, the anode electrode 81 overlaps the entire connection wiring line 24 in the plan view, and overlaps more than or equal to a half of the gate electrode 22 in the plan view. Thus, the coupling capacitance Cx is generated between the node N1 and the anode electrode of the organic EL element L1 in the known pixel circuit 91.

On the other hand, in the pixel circuit 15 according to the present embodiment, the anode electrode 31 of the organic EL element L1 is laid out such that the gate electrode 22 and the connection wiring line 24 are not overlapped with each other in a plan view as much as possible. Specifically, as illustrated in FIG. 4, of the first to third organic EL elements L1, even the second organic EL element L1 for green that is disposed closest to the node N1 (FIG. 2) is laid out such that the anode electrode 31G does not overlap the connection wiring line 24 and the contact hole 26 in a plan view, and overlaps approximately one fourth or less of the gate electrode 22 in a plan view. Further, the anode electrode 31 is disposed to avoid the opening 25, and does not overlap the opening 25 in the plan view. Thus, coupling capacitance between the node N1 and the anode electrode 31 of the organic EL element L1 is negligibly small in the pixel circuit 15 according to the present embodiment.

Figure 10:
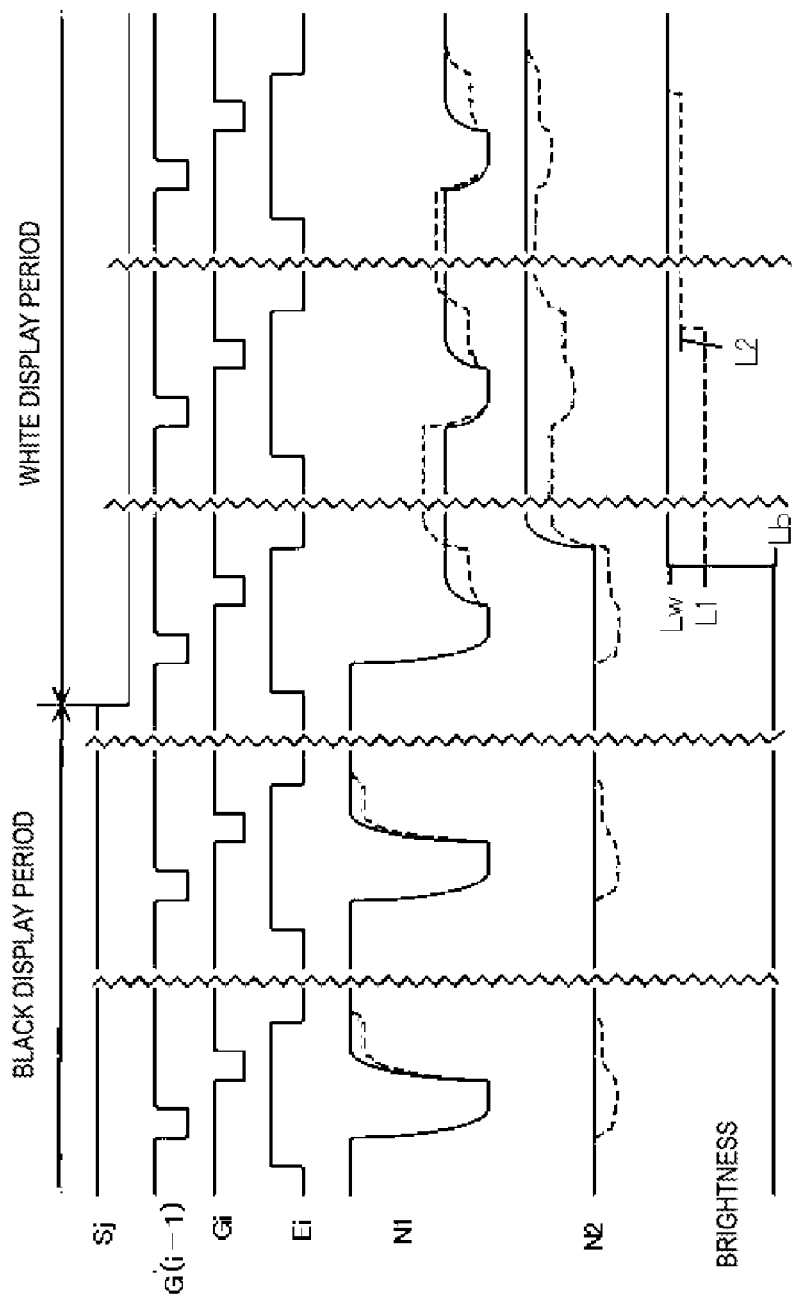
FIG. 10 is a signal waveform diagram of the organic EL display device illustrated in FIG. 1.

FIG. 10 is a signal waveform diagram of the organic EL display device illustrated in FIG. 1. In FIG. 10, changes in the input signals of the pixel circuit 15, changes in voltages of the nodes N1 and N2, and a change in brightness of the organic EL element L1 are illustrated by solid lines when white display is performed after black display. In FIG. 10, the same contents of the known pixel circuit 91 are illustrated by broken lines. Hereinafter, effects of the organic EL display device 10 according to the present embodiment will be described in comparison with the known organic EL display device.

When white display is performed after black display in the known organic EL display device, after writing of a data voltage is completed and the control line Ei is changed to the low level, a current passing through the thin film transistors M5, M4, and M1 and the organic EL element L1 flows, and a voltage of the anode electrode 81 of the organic EL element L1 rises. In the known pixel circuit 91, the coupling capacitance Cx exists between the node N1 and the anode electrode 81 of the organic EL element L1. Thus, when the voltage of the anode electrode 81 of the organic EL element L1 rises, a voltage of the gate electrode 22 of the thin film transistor M1 also rises. Therefore, the amount of current flowing through the thin film transistor M1 is fixed to be less than a predetermined amount, and brightness of the organic EL element L1 does not rise to a desired level (white level). As a result, white display cannot be properly performed in a frame period in which white display needs to be performed first.

A fluctuation amount of voltage of the anode electrode 81 of the organic EL element L1 gradually decreases in subsequent frame periods. Thus, brightness of the organic EL element L1 rises to a white level after a few frame periods, and white display can be properly performed. As described above, in the known organic EL display device, white display cannot be properly performed in a first few frame periods in which white display needs to be performed when white display is performed after black display (step response). Given that brightness of the organic EL element L1 during black display is Lb, and brightness of the organic EL element L1 during white display is Lw. As illustrated by the broken lines in FIG. 10, brightness of the organic EL element L1 included in the known organic EL display device is first changed from Lb to L1, then changed from L1 to L2, and then changed from L2 to Lw (Lb<L1<L2<Lw).

When white display is performed after black display in the organic EL display device 10 according to the present embodiment, after writing of a data voltage is completed and the control line Ei is changed to the low level, a voltage of the anode electrode 31 of the organic EL element L1 rises, similarly to the known organic EL display device. In the pixel circuit 15 according to the present embodiment, coupling capacitance between the node N1 and the anode electrode 31 of the organic EL element L1 is negligibly small. Thus, even when the voltage of the anode electrode 31 of the organic EL element L1 rises, a voltage of the gate electrode 22 of the thin film transistor M1 hardly rises. Therefore, a current flowing through the thin film transistor M1 immediately reaches a predetermined amount, and brightness of the organic EL element L1 rises to a desired level (white level). Therefore, white display can be properly performed in a frame period in which white display needs to be performed first.

Further, in the known pixel circuit 91, a data voltage needs to be increased by the coupling capacitance Cx and thus power consumption of the organic EL display device increases. On the other hand, in the organic EL display device 10 according to the present embodiment, a data voltage does not need to be increased by the coupling capacitance Cx and thus an increase in power consumption can be prevented.

As described above, in the organic EL display device 10 of the present embodiment, the anode electrode (first electrode) 31 of the organic EL element (electro-optical element) L1 is configured in a mortar shape. Therefore, the current density of the current flowing from the anode electrode 31 to the light-emitting element layer 32 can be reduced, and the lifespan of the organic EL element L1 can be extended, and thus the lifespan of the organic EL display device 10 can be extended. Further, in the organic EL display device 10 according to the present embodiment, the connection wiring line 24 formed in the wiring line layer (third wiring line layer) closer to the wiring line layer (anode electrode layer) in which the anode electrode 31 of the organic EL element L1 is formed than the wiring line layer (first wiring line layer) in which the control electrode of the drive transistor is formed is connected to the control electrode of the drive transistor (gate electrode 22 of the thin film transistor M1), and the anode electrode 31 of the organic EL element L1 is disposed without overlapping the connection wiring line 24 in a plan view. As a result, in the organic EL display device 10 according to the present embodiment, even when the lifespan is extended, since coupling capacitance between the node N1 connected to the control electrode of the drive transistor and the anode electrode 31 of the organic EL element L1 is reduced, a step response of the organic EL display device 10 can be prevented and power consumption of the organic EL display device 10 can be reduced.

In the organic EL display device 10 of the present embodiment, the anode electrode 31 is configured in a mortar shape and is the reflective electrode that reflects light from the light-emitting element layer 32 toward the display surface side of the display portion 11. Therefore, light emitted from the display surface to the outside can be concentrated, and optical characteristics (display quality) such as viewing angle characteristics and brightness of the organic EL display device 10 can be improved.

Figure 11:
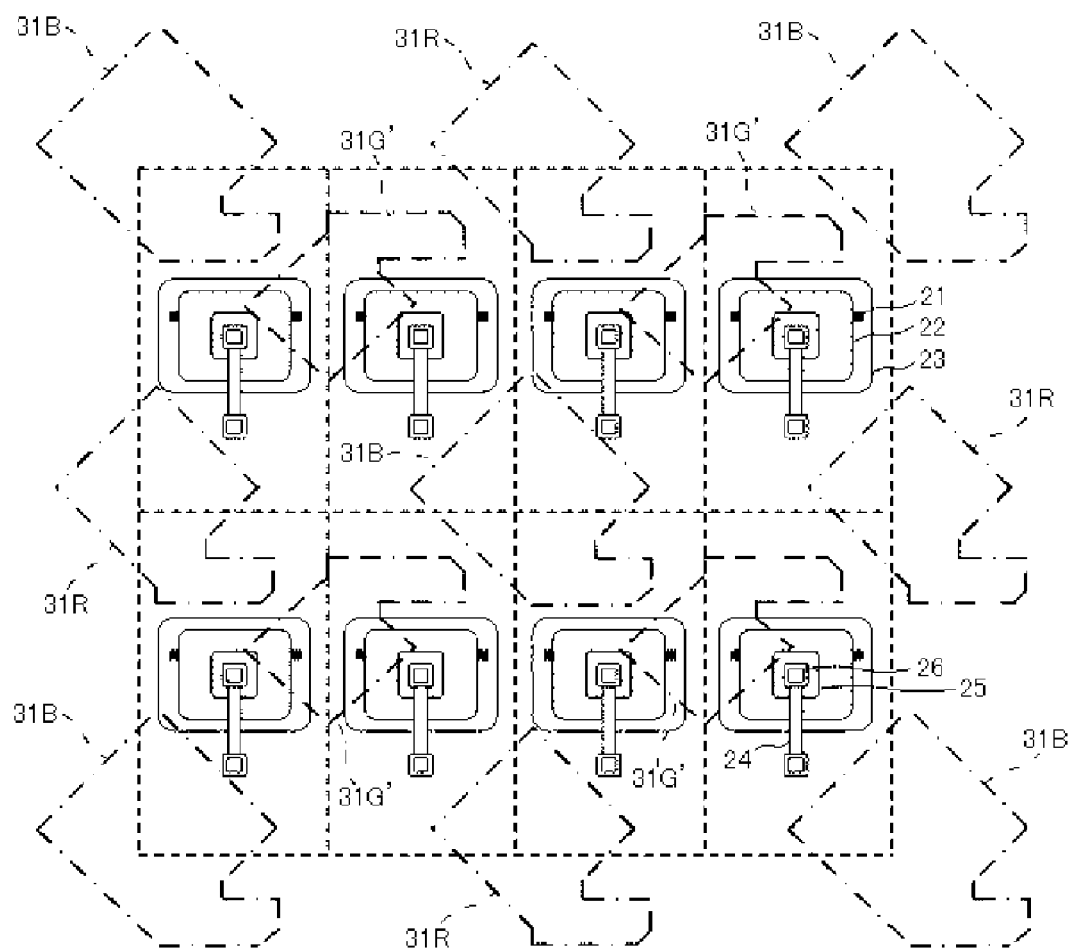
FIG. 11 is a layout diagram of a pixel circuit of an organic EL display device according to a modification of the first embodiment.

The following modification can be made on the organic EL display device 10 according to the present embodiment. FIG. 11 is a layout diagram of a pixel circuit of an organic EL display device according to the modification of the first embodiment. Also in FIG. 11, similarly to FIG. 4, an anode electrode 31G' of the organic EL element L1 is disposed without overlapping the connection wiring line 24 in a plan view. Further, the anode electrode 31G' is laid out without avoiding the opening 25 formed in the capacitance wiring line 23. As a result, the anode electrode 31G' slightly overlaps the opening 25. Note that the anode electrodes 31R and 31B for red and blue are disposed avoiding the opening 25, and do not overlap the opening 25 in a plan view, similarly to the first embodiment.

A first wiring line layer is farther from an anode electrode layer than a third wiring line layer. Thus, coupling capacitance when the anode electrode 31G' overlaps the gate electrode 22 in a plan view is sufficiently less than coupling capacitance when the anode electrode 31G' overlaps the connection wiring line 24 in a plan view. Therefore, even when the anode electrode 31G' slightly overlaps the opening 25, when the anode electrode 31G' does not overlap the connection wiring line 24 formed in the third wiring line layer in a plan view, coupling capacitance between the node N1 and the anode electrode 31G' of the organic EL element L1 is sufficiently small. Therefore, the organic EL display device according to the modification can also obtain the effects similar to those of the organic EL display device 10 according to the first embodiment.

Second Embodiment

An organic EL display device 10 according to a second embodiment has the same configuration (FIG. 1) as that of the organic EL display device 10 according to the first embodiment. However, the organic EL display device 10 according to the present embodiment includes a pixel circuit 41 illustrated in FIG. 12 instead of the pixel circuit 15 illustrated in FIG. 2. The same constituent elements in the present embodiment as those in the first embodiment are denoted by the same reference signs, and the description thereof will be omitted.

Figure 12:
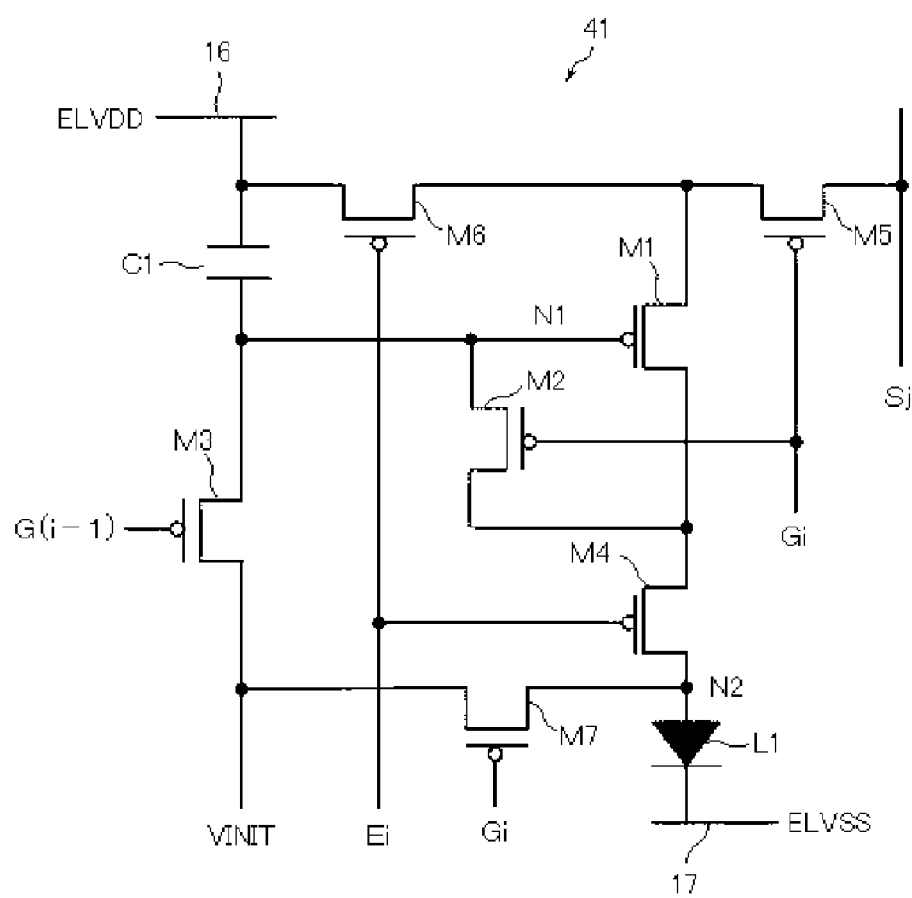
FIG. 12 is a circuit diagram of a pixel circuit of an organic EL display device according to a second embodiment.

FIG. 12 illustrates the pixel circuit 41 in an i-th row and a j-th column. The pixel circuit 41 illustrated in FIG. 12 includes an organic EL element L1, seven thin film transistors M1 to M7, and a capacitor C1, and is connected to scanning lines Gi and G(i−1), a control line Ei, and a data line Sj. Such a configuration of the pixel circuit 41 is called a 7T1C configuration. The thin film transistors M1 to M7 are p-channel transistors.

The pixel circuit 41 is obtained by adding the thin film transistor M7 to the pixel circuit 15 according to the first embodiment. One conduction electrode of the thin film transistor M7 (a right electrode in FIG. 12) is connected to an anode electrode 31 of the organic EL element L1. The initialization voltage VINIT is applied to the other conduction electrode of the thin film transistor M7. A gate electrode of the thin film transistor M7 is connected to the scanning line Gi. The thin film transistor M7 functions as a second initialization transistor including the first conduction electrode connected to the anode electrode 31 of the organic EL element L1, and the second conduction electrode to which the initialization voltage VINIT is applied. A control electrode of the second initialization transistor is connected to the scanning line Gi.

Similarly to the pixel circuit 15 according to the first embodiment, also in the pixel circuit 41 according to the present embodiment, the anode electrode 31 of the organic EL element L1 is laid out without overlapping a connection wiring line 24 connected to a gate electrode 22 of the thin film transistor M1 in a plan view. The anode electrode 31 of the organic EL element L1 is preferably disposed without overlapping an opening 25 formed in a capacitance wiring line 23 in a plan view. However, the anode electrode 31 of the organic EL element L1 may be disposed so as to slightly overlap the opening 25 formed in the capacitance wiring line 23.

Figure 13:
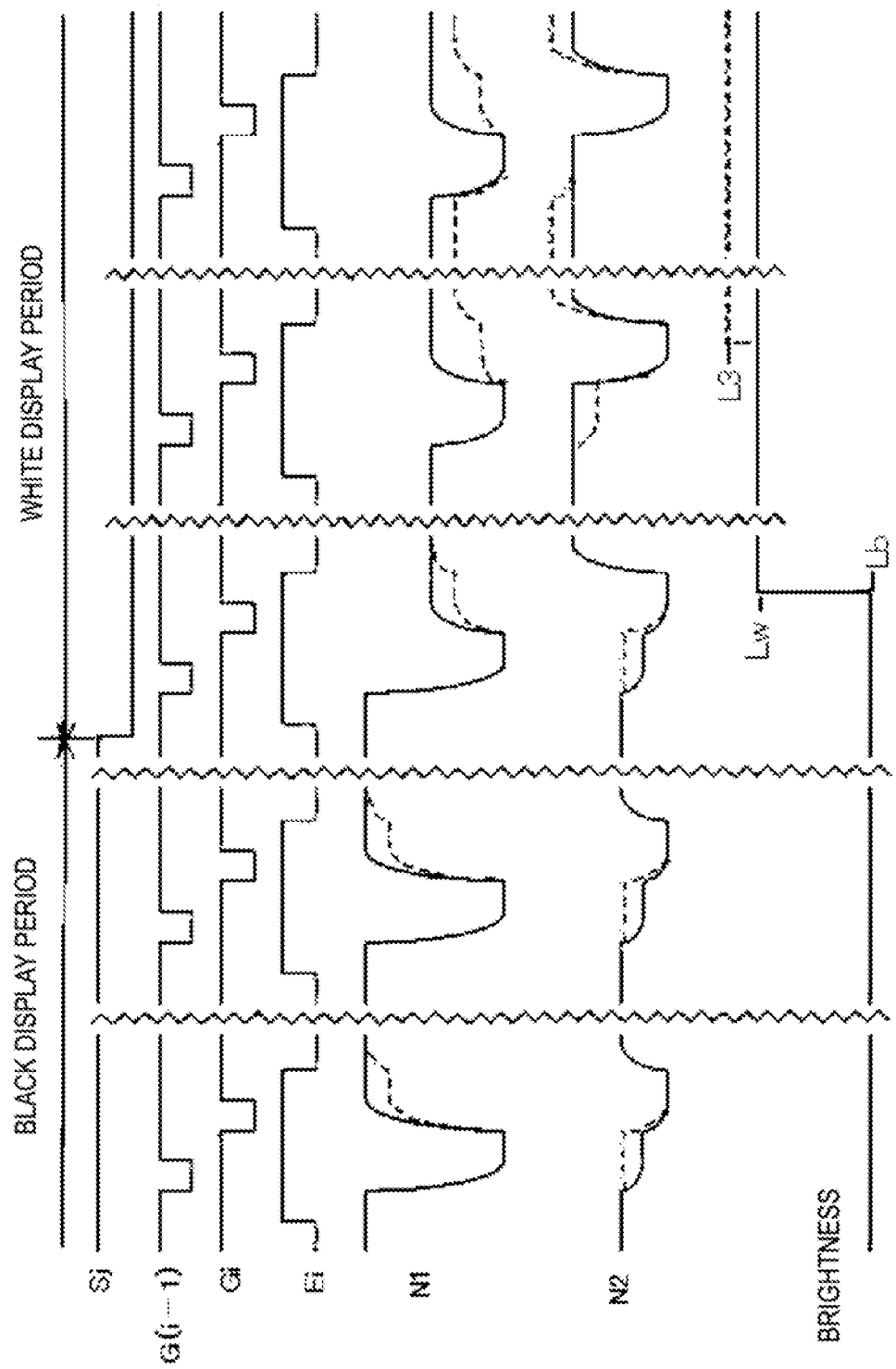
FIG. 13 is a signal waveform diagram of the organic EL display device according to the second embodiment.

FIG. 13 is a signal waveform diagram of the organic EL display device according to the second embodiment. FIG. 13 illustrates the same contents as those in FIG. 10 when white display is performed after black display. In the known organic EL display device, when the scanning signal Gi is at a high level, the thin film transistors M2, M5, and M7 are in an on state, and a compensation operation and resetting of a voltage of the anode electrode 81 of the organic EL element L1 are simultaneously performed. In the known pixel circuit 92, the coupling capacitance Cx exists between the node N1 and the anode electrode 81 of the organic EL element L1. Thus, when a voltage of the anode electrode 81 of the organic EL element L1 changes, a voltage of the gate electrode 22 of the thin film transistor M1 also changes. When white display is performed after black display, a change in voltage of the anode electrode 81 of the organic EL element L1 at the time of resetting is small. At this time, a change in gate voltage of the thin film transistor M1 is also small, and thus the gate voltage of the thin film transistor M1 can be properly controlled to a desired level.

Subsequently, when white display is performed after white display, a change in voltage of the anode electrode 81 of the organic EL element L1 at the time of resetting is large. At this time, a change in gate voltage of the thin film transistor M1 is also large, and thus the gate voltage of the thin film transistor M1 cannot be properly controlled to a desired level. When the gate voltage of the thin film transistor M1 decreases, a current flowing through the organic EL element L1 increases and brightness of the organic EL element L1 becomes greater than a desired level (white level). As illustrated by broken lines in FIG. 13, brightness of the organic EL element L1 included in the known organic EL display device is first changed from Lb to Lw, and then changed from Lw to L3 (Lb<Lw<L3). In subsequent frame periods, a voltage of the anode electrode 81 of the organic EL element L1 is initialized to the initialization voltage VINIT in each frame period, and thus the gate voltage of the thin film transistor M1 always decreases by the same amount. Thus, brightness of the organic EL element L1 in each frame period is almost constant brightness. As described above, a step response occurs at the time of resetting in the known organic EL display device.

Also in the organic EL display device 10 according to the present embodiment, similarly to the known organic EL display device, when the scanning signal Gi is at a high level, the thin film transistors M2, M5, and M7 are in an on state, and a compensation operation and resetting of a voltage of the anode electrode 31 of the organic EL element L1 are performed simultaneously. In the pixel circuit 41 according to the present embodiment, coupling capacitance between the node N1 and the anode electrode 31 of the organic EL element L1 is negligibly small. Thus, even when a voltage of the anode electrode 31 of the organic EL element L1 changes, a voltage of the gate electrode 22 of the thin film transistor M1 hardly changes. Therefore, also when white display is performed after white display, the gate voltage of the thin film transistor M1 can be properly controlled to a desired level, and brightness of the organic EL element L1 can be controlled to a desired level (white level).

Further, similarly to the organic EL display device 10 according to the first embodiment, in the organic EL display device 10 according to the present embodiment, a data voltage does not need to be increased by the coupling capacitance Cx and thus an increase in power consumption can be prevented.

As described above, in the organic EL display device 10 according to the present embodiment, similarly to the organic EL display device 10 according to the first embodiment, the step response can be prevented from occurring even when the lifespan is extended.

The organic EL display device 10 according to each of the embodiments described above can be modified in various ways. Although the pixel circuits 15 and 41 are laid out in a specific manner in the first and second embodiments, respectively, the pixel circuits 15 and 41 may be laid out in a form other than the above, for example. For example, at least one of a plurality of first electrodes (anode electrodes 31 of the organic EL elements L1) included in a plurality of pixel circuits may be disposed overlapping a capacitance wiring line 23 including an opening 25 in a plan view (first modification). A plurality of capacitance wiring lines 23 including openings 25 may be formed in parallel to each other, and at least one of a plurality of anode electrodes 31 included in a plurality of pixel circuits may be disposed overlapping both of two capacitance wiring lines 23 located close to each other in a plan view (second modification). At least one of a plurality of anode electrodes 31 included in a plurality of pixel circuits may be disposed overlapping a control electrode of a drive transistor in a plan view (third modification). A plurality of control electrodes (gate electrodes) of a plurality of drive transistors may be formed two-dimensionally, and at least one of a plurality of first electrodes included in a plurality of pixel circuits may be disposed overlapping all the control electrodes of four of the drive transistors located close to each other in a plan view. In the organic EL display devices according to the modifications, a pixel circuit may be formed in a plurality of wiring line layers including four or more metal wiring line layers.

The organic EL display device 10 including the pixel circuit having the specific configuration is described in the first and second embodiments, but an organic EL display device including another pixel circuit that includes an organic EL element L1 and a drive transistor and has a layout having the above-described characteristics may be configured. For example, an organic EL display device including a pixel circuit in which the thin film transistor M3 is omitted from the pixel circuit 15 may be configured. Further, a display portion 11 may not include a plurality of control lines in the organic EL display devices according to the modifications. In this case, a control line drive circuit does not need to be provided in the organic EL display devices according to the modifications.

Note that, in the description above, the case has been described in which the anode electrode 31 configured in a mortar shape is used, but the present embodiment is not limited thereto, and it is sufficient that the surface area of the anode electrode 31 in contact with the light-emitting element layer 32 can be increased to reduce the current density of the current flowing from the anode electrode 31 to the light-emitting element layer 32, and there is no limitation as long as it has a configuration in which a concave-convex portion is provided on the surface in contact with the light-emitting element layer. For example, a plurality of concave-convex portions may be provided on a surface of the anode electrode 31 in contact with the light-emitting element layer 32, or the entire surface may be formed in a convex shape. As described above, in the present embodiment, the surface area of the anode electrode 31 is increased in three dimensions so that the layout area of the pixel circuit 15 can be easily reduced, and the organic EL display device 10 capable of high definition display can be easily configured.

Further, in the description above, although the case has been described in which each of the anode electrodes 31R, 31G, and 31B for red, green, and blue colors is configured in a mortar shape, the disclosure is not limited thereto, and for example, only the anode electrode 31G for green disposed closest to the node N1 may be configured in a mortar shape.

In each of the embodiments described above, the organic EL display device is described as a display device as an example. The disclosure is also applicable to a display device including a plurality of light-emitting elements that are driven by an electrical current. For example, the disclosure is applicable to a display device including Quantum-dot light emitting diodes (QLEDs), which are light-emitting elements using a quantum dot-containing layer.

INDUSTRIAL APPLICABILITY

The disclosure is useful for an organic EL display device capable of preventing the a step response from occurring even when the lifespan is extended.

REFERENCE SIGNS LIST

10 Display device
11 Display portion
12 Display control circuit
13 Scanning line/control line drive circuit
14 Data line drive circuit
15, 41 Pixel circuit
16 High-level power supply wiring line (first conductive member)
17 Common electrode (second conductive member)
21 Semiconductor portion
22 Gate electrode (control electrode)
23 Capacitance wiring line
24 Connection wiring line
25 Opening
26 Contact hole
31, 31R, 31G, 31G', 31B Anode electrode (first electrode)
32 Light-emitting element layer
L1 Organic EL element (electro-optical element)
M1 TFT (drive transistor)
M2 TFT (threshold value compensation transistor)
M3 TFT (initialization transistor)
M4 TFT (second light emission control transistor)
M5 TFT (writing control transistor)
M6 TFT (first light emission control transistor)
M7 TFT (second initialization transistor)
C1 Capacitor

The invention claimed is:

1. A display device comprising:
a display portion including a plurality of scanning lines, a plurality of data lines, and a plurality of pixel circuits;
a scanning line drive circuit configured to drive the plurality of scanning lines; and
a data line drive circuit configured to drive the plurality of data lines,
wherein each of the plurality of pixel circuits includes
an electro-optical element including a first electrode, a second electrode, and a light-emitting element layer disposed between the first electrode and the second electrode, provided on a path connecting a first conductive member and a second conductive member for supplying a power supply voltage, and configured to emit light at brightness according to a current flowing through the path, and
a drive transistor provided in series with the electro-optical element on the path and configured to control an amount of current flowing through the path, and the first electrode of the electro-optical element is provided with a concave-convex portion on a surface in contact with the light-emitting element layer,
a control electrode of the drive transistor is connected to a connection wiring line formed in a wiring line layer closer to a wiring line layer in which the first electrode of the electro-optical element is formed than a wiring line layer in which the control electrode of the drive transistor is formed, and
the first electrode of the electro-optical element is disposed without overlapping the connection wiring line in a plan view.

2. The display device according to claim 1,
wherein each of the plurality of pixel circuits further includes a capacitance wiring line formed in a wiring line layer between the wiring line layer in which the control electrode of the drive transistor is formed and the wiring line layer in which the connection wiring line is formed,
the capacitance wiring line is disposed overlapping the control electrode of the drive transistor in a plan view and includes an opening in a part of a position overlapping the control electrode of the drive transistor, and
the control electrode of the drive transistor and the connection wiring line are connected to each other through a contact hole formed in the opening.

3. The display device according to claim 2,
wherein each of the plurality of pixel circuits further includes a semiconductor layer in which a semiconductor portion is formed, and
the opening overlaps the semiconductor layer.

4. The display device according to claim 2,
wherein at least one of a plurality of the first electrodes included in the plurality of pixel circuits is disposed overlapping the control electrode of the drive transistor in a plan view.

5. The display device according to claim 2,
wherein the control electrode of the drive transistor is formed two-dimensionally, and
at least one of a plurality of the first electrodes included in the plurality of pixel
circuits is disposed overlapping all the control electrodes of four of the drive transistors located close to each other in a plan view.

6. The display device according to claim 2,
wherein the control electrode of the drive transistor is formed in a first wiring line layer,
the capacitance wiring line is formed in a second wiring line layer in a layer above the first wiring line layer,
the connection wiring line is formed in a third wiring line layer in a layer above the second wiring line layer, and
the first electrode of the electro-optical element is formed in a layer above the third wiring line layer.

7. The display device according to claim 1,
wherein the display portion further includes a plurality of control lines,
the display device further includes a control line drive circuit configured to drive the plurality of control lines,
each of the plurality of pixel circuits further includes
a writing control transistor including a first conduction electrode connected to a data line of the plurality of data lines, a second conduction electrode connected to a first conduction electrode of the drive transistor, and a control electrode connected to a scanning line of the plurality of scanning lines,
a threshold value compensation transistor including a first conduction electrode connected to a second conduction electrode of the drive transistor, a second conduction electrode connected to the control electrode of the drive transistor, and a control electrode connected to the scanning line, a first light emission control transistor including a first conduction electrode connected to the first conductive member, a second conduction electrode connected to the first conduction electrode of the drive transistor, and a control electrode connected to a control line of the plurality of control lines, a second light emission control transistor including a first conduction electrode connected to the second conduction electrode of the drive transistor, a second conduction electrode connected to the first electrode of the electro-optical element, and a control electrode connected to the control line, and a capacitor provided between the first conductive member and the control electrode of the drive transistor, and the second electrode of the electro-optical element is connected to the second conductive member.

8. The display device according to claim 7, wherein each of the plurality of pixel circuits further includes an initialization transistor including a first conduction electrode connected to the control electrode of the drive transistor and a second conduction electrode to which an initialization voltage is applied.

9. The display device according to claim 8, wherein a control electrode of the initialization transistor is connected to a scanning line of a pixel circuit in an adjacent row.

10. The display device according to claim 8, wherein each of the plurality of pixel circuits further includes a second initialization transistor including a first conduction electrode connected to the first electrode of the electro-optical element and a second conduction electrode to which the initialization voltage is applied.

11. The display device according to claim 10, wherein a control electrode of the second initialization transistor is connected to the scanning line.

12. The display device according to claim 1, wherein the first electrode of the electro-optical element is configured in a mortar shape.

13. The display device according to claim 12, wherein the first electrode of the electro-optical element is a reflective electrode configured to reflect light from the light-emitting element layer of the electro-optical element to a display surface side of the display portion.

14. The display device according to claim 1 comprising:
as the electro-optical element, a first electro-optical element configured to emit red light, a second electro-optical element configured to emit green light, and a third electro-optical element configured to emit blue light, wherein, in the first electro-optical element, the second electro-optical element, and the third electro-optical element, the respective first electrodes differ from each other in size.

15. The display device according to claim 14, wherein, in the first electro-optical element, the second electro-optical element, and the third electro-optical element, the first electrode of the third electro-optical element is configured to be larger than the first electrode of the first electro-optical element, and the first electrode of the first electro-optical element is configured to be larger than the first electrode of the second electro-optical element.

16. The display device according to claim 14 comprising:
as the plurality of pixel circuits, a first pixel circuit including the first electro-optical element, a second pixel circuit including the second electro-optical element, and a third pixel circuit including the third electro-optical element, wherein an arrangement pattern of the first pixel circuit, the second pixel circuit, and the third pixel circuit is a PenTile arrangement pattern.

17. The display device according to claim 1, wherein the electro-optical element is an organic light emitting diode.

* * * * *